(12) United States Patent
Miyoshi et al.

(10) Patent No.: US 8,598,626 B2
(45) Date of Patent: Dec. 3, 2013

(54) EPITAXIAL SUBSTRATE FOR SEMICONDUCTOR DEVICE, SCHOTTKY JUNCTION STRUCTURE, AND LEAKAGE CURRENT SUPPRESSION METHOD FOR SCHOTTKY JUNCTION STRUCTURE

(75) Inventors: Makoto Miyoshi, Nagoya (JP); Yoshitaka Kuraoka, Nagoya (JP); Shigeaki Sumiya, Nagoya (JP); Mikiya Ichimura, Nagoya (JP); Tomohiko Sugiyama, Nagoya (JP); Mitsuhiro Tanaka, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 402 days.

(21) Appl. No.: 12/853,685

(22) Filed: Aug. 10, 2010

(65) Prior Publication Data

US 2011/0062493 A1    Mar. 17, 2011

(30) Foreign Application Priority Data

Sep. 15, 2009   (JP) ................. 2009-212755

(51) Int. Cl.
    *H01L 29/778*     (2006.01)
(52) U.S. Cl.
    USPC .................... 257/192; 257/E29.093; 438/172
(58) Field of Classification Search
    USPC .......................................... 257/192, E29.093
    See application file for complete search history.

(56) References Cited

U.S. PATENT DOCUMENTS

| | | | |
|---|---|---|---|
| 7,170,111 B2* | 1/2007 | Saxler | 257/194 |
| 2004/0124435 A1 | 7/2004 | D'Evelyn et al. | |
| 2006/0043396 A1* | 3/2006 | Tsuda et al. | 257/94 |
| 2007/0018198 A1 | 1/2007 | Brandes et al. | |
| 2009/0045438 A1* | 2/2009 | Inoue et al. | 257/192 |
| 2010/0193839 A1* | 8/2010 | Takatani | 257/192 |

OTHER PUBLICATIONS

J. Kuzmik, et al., "*InAlN/GaN HEMTs: A First Insight into Technological Optimization*," IEEE Transactions on Electron Devices, vol. 53, No. 3, Mar. 2006, pp. 422-426.

Toshihide Kikkawa, "*Highly Reliable 250 W High Electron Mobility Transistor Power Amplifier*," Japanese Journal of Applied Physics, vol. 44, No. 7A, 2005, pp. 4896-4901.

Stacia Keller, et al., "*Gallium Nitride Based High Power Heterojunction Field Effect Transistors: Process Development and Present Status at USCB*," IEEE Trans. Electron Devices, vol. 48, No. 3, Mar. 2001, pp. 552-559.

F. Medjdoub, et al., "*Can InAlN/GaN Be an Alternative to High Power/High Temperature AlGaN/GaN Devices?*," IEEE IEDM Tech. Digest, 2006, pp. 673-676.

\* cited by examiner

*Primary Examiner* — Steven J Fulk
(74) *Attorney, Agent, or Firm* — Burr & Brown

(57) ABSTRACT

Provided is an epitaxial substrate for semiconductor device that is capable of achieving a semiconductor device having high reliability in reverse characteristics of schottky junction. An epitaxial substrate for semiconductor device obtained by forming, on a base substrate, a group of group III nitride layers by lamination such that a (0001) crystal plane of each layer is approximately parallel to a substrate surface includes: a channel layer formed of a first group III nitride having a composition of $In_{x1}Al_{y1}Ga_{z1}N$ (x1+y1+z1=1, z1>0); and a barrier layer formed of a second group III nitride having a composition of $In_{x2}Al_{y2}N$ (x2+y2=1, x2>0, y2>0), wherein the second group III nitride is a short-range-ordered mixed crystal having a short-range order parameter α satisfying a range where $0 \le \alpha \le 1$.

7 Claims, 2 Drawing Sheets

FIG. 2

| COMPOSITION OF BARRIER LAYER | α | INITIAL CHARACTERISTICS | AFTER CONTINUOUS ENERGIZATION | |
|---|---|---|---|---|
| | | LEAKAGE CURRENT (A/cm$^2$) | LEAKAGE CURRENT (A/cm$^2$) | BREAKDOWN VOLTAGE (V) |
| In$_{0.14}$Al$_{0.86}$N | 0.95 | <0.00001 | <0.00001 | 1650 |
| | 0.41 | <0.00001 | <0.00001 | 1640 |
| | 0.38 | <0.00001 | <0.00001 | 1250 |
| | 0.2 | <0.00001 | <0.00001 | 1230 |
| | -0.3 | <0.00001 | 0.0035 | 450 |
| | -0.6 | <0.00001 | 0.0024 | 320 |
| In$_{0.18}$Al$_{0.82}$N | 0.97 | <0.00001 | <0.00001 | 1640 |
| | 0.42 | <0.00001 | <0.00001 | 1650 |
| | 0.36 | <0.00001 | <0.00001 | 1210 |
| | 0.1 | <0.00001 | <0.00001 | 1220 |
| | -0.4 | <0.00001 | 0.0042 | 430 |
| | -0.5 | <0.00001 | 0.0031 | 330 |
| In$_{0.22}$Al$_{0.78}$N | 0.92 | <0.00001 | <0.00001 | 1620 |
| | 0.43 | <0.00001 | <0.00001 | 1650 |
| | 0.39 | <0.00001 | <0.00001 | 1210 |
| | 0.15 | <0.00001 | <0.00001 | 1180 |
| | -0.3 | <0.00001 | 0.0042 | 400 |
| | -0.6 | <0.00001 | 0.0045 | 305 |

EPITAXIAL SUBSTRATE FOR SEMICONDUCTOR DEVICE, SCHOTTKY JUNCTION STRUCTURE, AND LEAKAGE CURRENT SUPPRESSION METHOD FOR SCHOTTKY JUNCTION STRUCTURE

DESCRIPTION OF RELATED ART

1. Field of the Invention

The present invention relates to an epitaxial substrate that has a multi-layer structure composed of a group III nitride semiconductor, and more particularly, to a multi-layer structured epitaxial substrate for electronic devices.

2. Description of the Background Art

Nitride semiconductors having high breakdown electric field and high saturation electron velocity have been attracting attention as the next generation of semiconductor materials for high-frequency/high-power devices. For example, a high electron mobility transistor (HEMT) device formed by laminating a barrier layer composed of AlGaN and a channel layer composed of GaN takes advantage of the feature that high-concentration two-dimensional electron gas (2DEG) is generated at a lamination interface (hetero interface) owing to a polarization effect (spontaneous polarization effect and piezo polarization effect) inherent in a nitride material (for example, see "Highly Reliable 250 W High Electron Mobility Transistor Power Amplifier", Toshihide Kikkawa, Jpn. J. Appl. Phys. 44 (2005), p. 4896).

As a base substrate of the substrate for HEMT device, for example, a single crystal (heterogeneous single crystal) having a composition different from that of a group III nitride, such as silicon and SiC, is used in some cases. In this case, a buffer layer such as a strained superlattice layer and a low-temperature growth buffer layer is typically formed as an initial growth layer on the base substrate. Therefore, the most basic configuration of a substrate for HEMT device using a base substrate formed of heterogeneous single crystal is obtained by epitaxially fanning a barrier layer, a channel layer and a buffer layer on a base substrate. In addition, for the purpose of accelerating spatial confinement of two-dimensional electron gas, a spacer layer having a thickness of approximately 1 nm is provided between the barrier layer and the channel layer in some cases. The spacer layer is composed of for example, AlN. Moreover, for the purposes of controlling an energy level on the topmost surface of the substrate for HEMT device and improving contact characteristics with an electrode, for example, a cap layer composed of an n-type GaN layer or a superlattice layer is formed on the barrier layer in some cases.

In a case of a nitride HEMT device having the most typical configuration in which a channel layer is formed of GaN and a barrier layer is formed of AlGaN, it is known that the concentration of two-dimensional electron gas existing in a substrate for HEMT device increases along with an increase in AlN mole fraction of AlGaN that forms the barrier layer (for example, see "Gallium Nitride Based High Power Heterojunction Field Effect Transistors: Process Development and Present Status at USCB", Stacia Keller, Yi-Feng Wu, Giacinta Parish, Naiqian Ziang, Jane J. Xu, Bernd P. Keller, Steven P. DenBaars, and Umesh K. Mishra, IEEE Trans. Electron Devices 48 (2001), p. 552). It is conceivable that controllable current density of a HEMT device, that is, power density capable of being utilized can be improved significantly if the concentration of two-dimensional electron gas can be increased significantly.

Further, growing attention is also paid to the HEMT device that has a low dependence on the piezo polarization effect, is capable of generating two-dimensional electron gas at high concentration almost only by spontaneous polarization, and has the structure with small strains, such as the HEMT device in which a channel layer is formed of GaN and a barrier layer is formed of InAlN (for example, see "Can InAlN/GaN be an alternative to high power/high temperature AlGaN/GaN devices?", F. Medjdoub, J.-F. Carlin, M. Gonschorek, E. Feltin, M. A. Py, D. Ducatteau, C. Gaquiere, N. Grandjean, and E. Kohn, IEEE IEDM Tech. Digest in IEEE IEDM 2006, p. 673).

In order to put the above-mentioned HEMT device or a substrate for HEMT device that is a multi-layer structure used in manufacturing the same to practical use, various problems need to be solved; problems related to performance improvement such as increase of power density and efficiency, problems related to functional improvement such as achieving normally-off operation, and fundamental problems such as enhancing reliability and reducing cost. The above-mentioned problems are individually tackled vigorously.

One of the above-mentioned problems is to improve schottky junction characteristics. Specifically, it is required to suppress reverse leakage current and increase breakdown voltage.

SUMMARY OF THE INVENTION

The present invention is directed to an epitaxial substrate for semiconductor device.

According to the present invention, an epitaxial substrate for semiconductor device includes: a base substrate; and a group of group III nitride layers obtained by foaming a (0001) crystal plane of each of the group III nitride layers so as to be approximately parallel to a substrate surface of the base substrate by lamination, the group III nitride layer group including: a channel layer formed of a first group III nitride having a composition of $In_{x1}Al_{y1}Ga_{z1}N$ (x1+y1+z1=1, z1>0); and a barrier layer formed of a second group III nitride having a composition of $In_{x2}Al_{y2}N$ (x2+y2=1, x2>0, y2>0), wherein the second group III nitride is a short-range-ordered mixed crystal having a short-range order parameter α satisfying a range where $0 \leq \alpha \leq 1$.

According to the present invention, it is possible to obtain a semiconductor device having excellent reliability in reverse characteristics of schottky junction.

Therefore, an object of the present invention is to provide an epitaxial substrate for semiconductor device that is capable of achieving a semiconductor device having excellent reliability in reverse characteristics of schottky junction.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a table showing a list of compositions and values of short-range order parameters α of epitaxial substrates according to Inventive Example and results of the measurement performed on schottky diode devices manufactured using the epitaxial substrates.

DETAILED DESCRIPTION OF THE INVENTION

Configuration of Epitaxial Substrate

Figure 1:
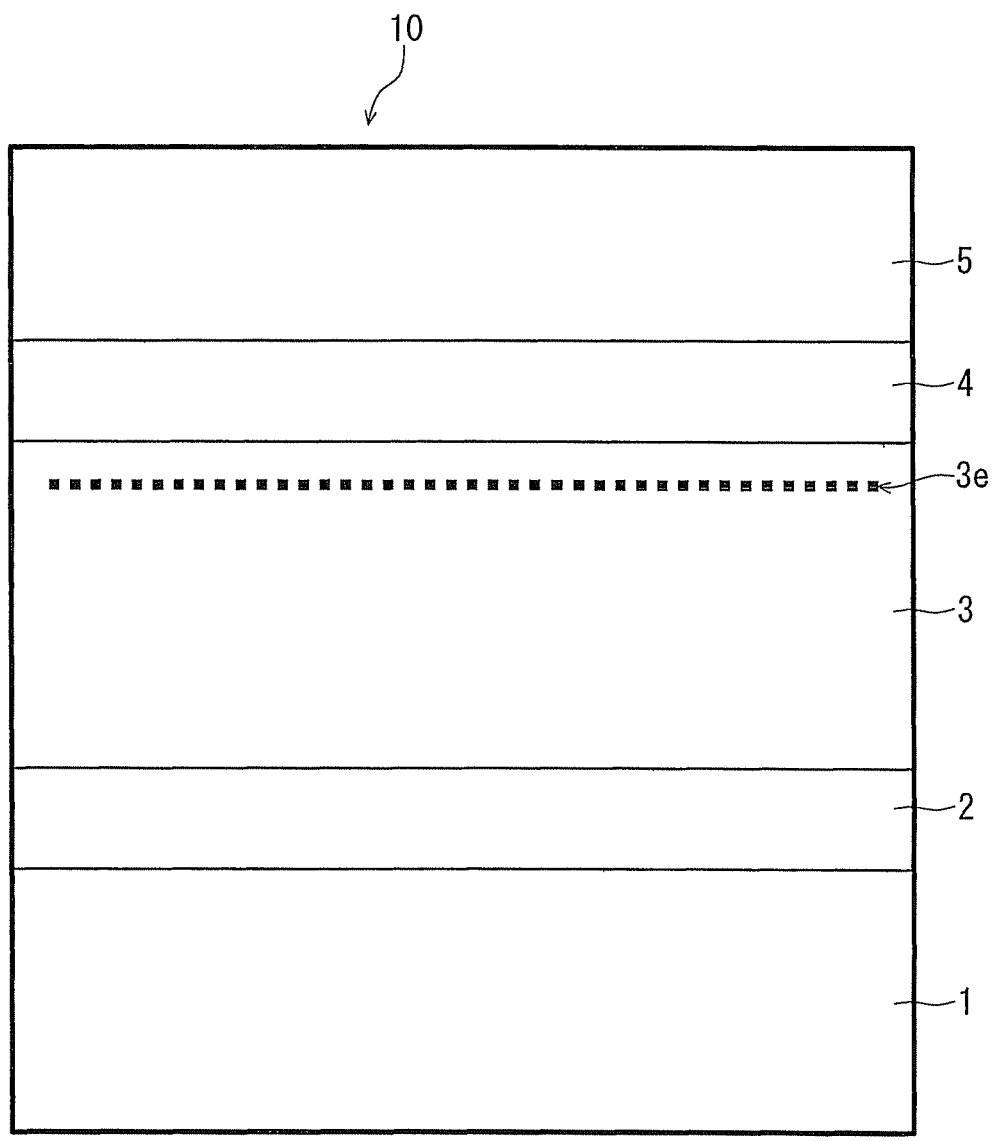
FIG. 1 is a schematic cross-sectional view schematically showing a configuration of an epitaxial substrate according to a preferred embodiment of the present invention.

FIG. 1 is a schematic cross-sectional view schematically showing the configuration of an epitaxial substrate 10 according to a preferred embodiment of the present invention. The epitaxial substrate 10 has the configuration in which a base substrate 1, a buffer layer 2, a channel layer 3, a spacer layer 4 and a barrier layer 5 are formed by lamination. Note that ratios of thickness of the respective layers in FIG. 1 do not reflect actual ones. The buffer layer 2, the channel layer 3, the spacer layer 4 and the barrier layer 5 are preferred examples of layers that are epitaxially formed (details thereof are described below) using the metal organic chemical vapor deposition method (MOCVD method).

Hereinbelow, while description is given of a case where the MOCVD method is used for the formation of each layer, other epitaxial growth technique, for example, the technique appropriately selected from various vapor phase growth methods and liquid phase growth methods such as MBE, HVPE and LPE may be used as long as it is the technique capable of forming each layer for providing excellent crystallinity. Alternatively, different growth methods may be used in combination.

Any substrate may be used as the base substrate 1 as long as a nitride semiconductor layer having excellent crystallinity can be formed thereon, without any particular limitation. A 6H—SiC single crystal substrate is preferably used as an example, and a substrate composed of sapphire, Si, GaAs, spinel, MgO, ZnO, ferrite or the like may be used.

The buffer layer 2 is formed of AlN to have a thickness of approximately several hundreds of nm, for making crystal quality of the channel layer 3, the spacer layer 4 and the barrier layer 5 that are formed thereon excellent. For example, the buffer layer 2 is preferably formed to have a thickness of 200 nm.

The channel layer 3 is formed of a group III nitride having a composition of $In_{x1}Al_{y1}Ga_{z1}N$ (x1+y1+z1=1) so as to have a thickness of approximately several µm. The channel layer 3 is preferably formed of a group III nitride having a composition of $Al_{y1}Ga_{z1}N$ (y1+z1=1, z1>0), and is more preferably formed of GaN.

On the other hand, the barrier layer 5 is formed of a group III nitride having a composition of $In_{x2}Al_{y2}N$ (x2+y2=1, x2>0, y2>0) so as to have a thickness of several nm to several tens of nm. Preferably, 0.14≤x2≤0.22. A value of x2 outside this range is not preferable because strains exerted on the barrier layer 5 exceed ±0.5%, leading to a larger influence of crystal strains on the reliability of schottky junction. Note that the barrier layer 5 is formed as a short-range-ordered mixed crystal. The barrier layer 5 is described below in detail.

Further, the spacer layer 4 is provided between the channel layer 3 and the barrier layer 5. The spacer layer 4 is formed of a group III nitride that has a composition of $In_{x3}Al_{y3}Ga_{z3}N$ (x3+y3+z3=1) and contains at least Al so as to have a thickness in a range of 0.5 nm to 1.5 nm.

In the epitaxial substrate 10 having the above-mentioned layer configuration, a two-dimensional electron gas region 3e in which two-dimensional electron gas is present at high concentration is formed at an interface between the channel layer 3 and the spacer layer 4 (more specifically, at a portion of the channel layer 3 in the vicinity of the interface).

Preferably, the spacer layer 4 and the barrier layer 5 are formed such that a bandgap of the group III nitride constituting the spacer layer 4 satisfies the composition range of becoming equal to or more than a bandgap of the group III nitride constituting the barrier layer 5. In such a case, an alloy scattering effect is suppressed, leading to improved concentration as well as mobility of two-dimensional electron gas. The spacer layer 4 is more preferably formed of AlN (x3=0, y3=1, z3=0). In such a case, the spacer layer 4 is a binary compound of Al and N, and thus an alloy scattering effect is suppressed further compared with the case of a ternary compound containing Ga, with the result that the concentration and mobility of two-dimensional electron gas are improved. Note that the discussion regarding the above-mentioned composition range does not exclude the fact that the spacer layer 4 contains impurities.

Note that the epitaxial substrate 10 is not necessarily required to include the spacer layer 4, and the barrier layer 5 may be formed directly on the channel layer 3. In such a case, the two-dimensional electron gas region 3e is formed at the interface between the channel layer 3 and the barrier layer 5.

Other constituent elements such as an electrode pattern are appropriately provided to the epitaxial substrate 10 having the configuration described above, which makes it possible to obtain various semiconductor devices such as a HEMT device and a diode device.

Barrier Layer

As described above, in the epitaxial substrate 10 according to this preferred embodiment, the barrier layer 5 composed of the group III nitride having the composition of $In_{x2}Al_{y2}N$ (x2+y2=1, x2>0, y2>0) is formed as a short-range-ordered mixed crystal. The barrier layer 5 is described below in more detail.

First, a short-range order parameter α that is a parameter defining a short-range-ordered mixed crystal is described. Generally speaking, the short-range order parameter α is an indicator representing a degree at which exotic atoms are present at the nearest neighbor lattice position around a lattice position of certain atom, which can be evaluated by a known technique using X-ray diffuse scattering.

In a case of a ternary nitride mixed crystal having the composition of $In_{x2}Al_{y2}N$ constituting the barrier layer 5, the hexagonal wurtzite structure is a stable structure, and if coordinates of the group III atoms are represented by (0, 0, 0) and (⅓, ⅔, ½), coordinates of nitrogen atoms are represented by (0, 0, ⅜) and (⅓, ⅔, ⅞). That is, in the hexagonal wurtzite structure, a sublattice of a group III atom and a sublattice of a nitrogen atom are arranged by being deviated from each other by ⅜ in a c-axis direction. As a result, there is obtained the structure in which a tetrahedron of nitrogen atoms (or group III atoms) surrounds one group III atom (or nitride atom), and the group III atom bonds to the group III atom that is the nearest neighbor atom of other group III sublattice, through nitrogen atoms. Note that all group III atoms bond to nitrogen atoms in an equivalent manner, and thus considering only sublattices of group III atoms, it is possible to obtain a short-range order parameter α regarding an arrangement of the group III atoms.

Specifically, when focusing on In atom positioned at a lattice point on a sublattice of the group III atom and representing a probability of finding an Al atom at the nearest neighbor lattice point of its lattice point by $P_{In-Al}$, a short-range order parameter α is defined by the following expression.

$$\alpha = 1 - P_{In-Al}/x2 \quad (1)$$

From Expression (1), α=0 when an existence ratio of an Al atom at the nearest neighbor lattice position of an In atom is equal to the composition ratio ($P_{In-Al}$=x2), α<0 when an existence ratio of an Al atom is larger than the composition ratio ($P_{In-Al}$>x2), and α>0 when the ratio of an Al atom is smaller than the composition ratio ($P_{A-B}$<x). In theory, −1<α<1 (only an Al atom exists in a case of α=−1, whereas only an In atom exists in a case where α=1). α<0 indicates a high frequency at which different atoms are alternately arranged, while α>0 indicates a high frequency at which the same types of atoms are adjacent to each other to form a cluster.

In this preferred embodiment, a crystal layer satisfying 0<α<1 is referred to as a short-range-ordered mixed crystal, and the barrier layer 5 is formed as the short-range-ordered mixed crystal. As a result, schottky junction characteristics of a semiconductor device manufactured using the epitaxial substrate 10 are improved compared with a conventional case. Specifically, the reverse leakage current is suppressed over time, and a high breakdown voltage is achieved. For example, even after the continuous energization is performed for 48 hours at 150° C. with application of 200 V, the leakage current is maintained at $1 \times 10^{-5}$ A/cm² or less. In addition, the breakdown voltage before device destruction is approximately 1,200 V or more. In particular, in a case where 0.4<α<1.0 is satisfied, a high breakdown voltage of 1,600 V or more is achieved.

As described above, according to this preferred embodiment, when a barrier layer of an epitaxial substrate is formed as a short-range-ordered mixed crystal of InAlN, schottky junction characteristics of a semiconductor device manufactured using this epitaxial substrate are improved, and thus there is achieved a semiconductor device having high reliability in reverse characteristics of schottky junction.

Method of Manufacturing an Epitaxial Substrate

Next, the method of manufacturing the epitaxial substrate 10 having the above-mentioned configuration is described.

The epitaxial substrate 10 can be manufactured with a known MOCVD reactor. Specifically, there is used an MOCVD reactor configured such that a reactor is capable of being supplied with a metal organic (MO) source gas (TMI, TMA and TMG) for In, Al and Ga, an ammonia gas, a hydrogen gas and a nitrogen gas.

First, for example, a 6H—SiC substrate that has (0001) plane orientation and a diameter of two inches is prepared as the base substrate 1, and the base substrate 1 is placed on a susceptor provided in the reactor of the MOCVD reactor. The inside of the reactor is replaced with vacuum gas, and then, an atmosphere in hydrogen/nitrogen mixed flow state is formed while maintaining a pressure inside the reactor at a predetermined value of 5 kPa to 50 kPa. After that, the temperature of the substrate is raised through susceptor heating.

When the susceptor temperature reaches a predetermined temperature of 950° C. to 1,250° C. (for example, 1,050° C.), which is a buffer layer forming temperature, Al source gas and NH₃ gas are introduced into the reactor, to thereby form an AlN layer serving as the buffer layer 2.

After the MN layer is formed, the susceptor temperature is maintained at a predetermined channel layer forming temperature, and metal organic source gas and ammonia gas are introduced into the reactor in accordance with the composition of the channel layer 3, thereby forming an $In_{x1}Al_{y1}Ga_{z1}N$ layer (where x1=0, 0≤y1≤0.3) serving as the channel layer 3. Here, a channel layer forming temperature T1 is a value determined in the temperature range of 950° C. or more to 1,250° C. or less in accordance with a value of an AlN mole fraction y1 of the channel layer 3. Note that the pressure in reactor when forming the channel layer 3 is not particularly limited, and can be appropriately selected from the range of 10 kPa to an atmospheric pressure (100 kPa).

After the formation of the $In_{x1}Al_{y1}Ga_{z1}N$ layer, the inside of the reactor is maintained at the nitrogen gas atmosphere while keeping the susceptor temperature, and the reactor pressure is set to 10 kPa. After that, metal organic source gas and ammonia gas are introduced into the reactor, whereby an $In_{x3}Al_{y3}Ga_{z3}N$ layer serving as the spacer layer 4 is formed to have a predetermined thickness.

After the formation of the $In_{x3}Al_{y3}Ga_{z3}N$ layer, in order to form an $In_{x2}Al_{y2}N$ layer serving as the barrier layer 5, the susceptor temperature is kept at a predetermined barrier layer forming temperature of 650° C. or more and 800° C. or less so that the pressure in reactor is maintained at a predetermined value between 1 kPa and 30 kPa. Then, ammonia gas and metal organic source gas of a flow rate corresponding to the composition of the barrier layer 5 are introduced into the reactor so that a so-called V/III ratio takes a predetermined value of 3,000 or more and 20,000 or less. On that occasion, the barrier layer 5 is formed as a crystal layer having a larger value of short-range order parameter α as surface migration of constituent atomic species (In, Al, N) during the progress of deposition growth of the barrier layer 5 is more suppressed, by appropriately controlling the barrier layer forming temperature, pressure in reactor and V/III ratio. More specifically, the suppression of surface migration is more easily achieved by reducing a susceptor temperature, increasing a reactor pressure and advancing a source charging rate, but it is merely a general tendency. Actually, the growth conditions of a barrier layer suitable for the suppression of surface migration depend on the structure of a reactor used in manufacturing the epitaxial substrate 10, and thus are not uniquely determined. Manufacturing of the epitaxial substrate 10 is completed when the barrier layer 5 is formed.

INVENTIVE EXAMPLE

In this inventive example, there were foamed a plurality of epitaxial substrates having different compositions of barrier layer and different values of short-range order parameter α. The composition of the barrier layer was set to three levels of $In_{0.14}Al_{0.86}N$, $In_{0.18}Al_{0.82}N$ and $In_{0.22}Al_{0.78}N$, and the short-range order parameter α was set to six levels including cases of negative one and positive one.

Specifically, first, a plurality of 6H—SiC substrates that have (0001) plane orientation and a diameter of three inches were prepared as the base substrate. Each of the substrates was placed in a reactor of an MOCVD reactor, and an inside of the reactor was replaced with vacuum gas. After that, a pressure in reactor was set to 30 kPa, thereby forming the atmosphere in hydrogen/nitrogen mixed flow state. Then, a temperature of the base substrate was raised through susceptor heating.

When a susceptor temperature reached 1,050° C., TMA bubbling gas and ammonia gas were introduced into the reactor, to thereby form an AlN layer that serves as the buffer layer and has a thickness of 200 nm.

Then, the susceptor temperature was set to a predetermined temperature, and TMG bubbling gas as metal organic source gas and ammonia gas were introduced into the reactor at a predetermined flow rate, thereby forming a GaN layer having a thickness of 2 μm as the channel layer.

After the channel layer was obtained, the reactor pressure was set to 10 kPa, and then TMA bubbling gas and ammonium gas were introduced into the reactor, thereby forming the AlN layer serving as the spacer layer to have a thickness of 1.2 nm.

After the formation of the spacer layer, next, the barrier layer was formed to have a thickness of 16 nm. On that occasion, a value of a short-range order parameter α is caused to vary for each sample even though having the same composition by changing the susceptor temperature, reactor pressure and V/III ratio for each sample while satisfying the conditions for forming a barrier layer having a target composition.

After the formation of the barrier layer, the susceptor temperature was lowered to approximately room temperature, and the inside of the reactor was returned to the atmospheric pressure. Then, the manufactured epitaxial substrate was taken out. As a result, the epitaxial substrate was obtained.

The barrier layer of the obtained epitaxial substrate was subjected to X-ray diffuse scattering measurement, to thereby obtain a short-range order parameter α in accordance with Expression (1).

Next, for evaluating electrical characteristics, a concentric schottky diode device was manufactured using the obtained epitaxial substrate. As a cathode ohmic electrode positioned outside a concentric electrode pattern, a meal layer formed of Ti/Al/Ni/Au (film thickness thereof is 25/75/15/100 nm) was used. In order to make contact characteristics excellent, the ohmic electrode was subjected to heat treatment for 30 seconds in the nitrogen gas atmosphere at 800° C. Further, as an anode schottky electrode positioned inside the concentric pattern, a metal layer formed of Pt/Au (film thickness thereof is 20/200 nm) was used. Note that a diameter of the anode electrode was 200 μm and an electrode distance was 10 μm.

As to the obtained schottky diode device, a leakage current during application of 40 V was measured as initial characteristics at room temperature. Then, continuous energization in the state of being applied with 200 V at 150° C. was performed for 48 hours, and then a leakage current during application of 40 V was measured at room temperature again. In addition, the breakdown voltage bringing device destruction was measured. FIG. 2 is a table showing a list of compositions and values of short-range order parameters α of epitaxial substrates and results of the measurement performed on the schottky diode devices manufactured using the epitaxial substrates.

As shown in FIG. 2, in the samples where α>0, leakage currents after the continuous energization test did not change from the initial characteristics and were maintained at $1 \times 10^{-5}$ A/cm² or less, whereas in the samples where α<0, the leakage current increased due to the continuous energization. Further, in the samples where α>0, the breakdown voltage bringing device destruction was approximately 1,200 V or more, whereas in the samples where α<0, the breakdown voltage was a small value, 450 V or less. Note that in a case where the short-range order parameter α satisfies 0.4<α<1.0, a higher breakdown voltage of 1,600 V or more was obtained.

The results above indicate that it is effective for the improvement of reverse characteristics of schottky junction and enhancement of its reliability that a barrier layer is formed as a short-range-ordered mixed crystal in which a short-range order parameter α satisfies 0<α<1, and that a higher breakdown voltage is obtained when 0.4<α<1.0 is satisfied.

While the invention has been shown and described in detail, the foregoing description is in all aspects illustrative and not restrictive. It is therefore understood that numerous modifications and variations can be devised without departing from the scope of the invention.

What is claimed is:

1. An epitaxial substrate for semiconductor device, comprising:
    a base substrate;
    a buffer layer made of AlN; and
    a group of group III nitride layers obtained by forming a (0001) crystal plane of each of said group III nitride layers so as to be approximately parallel to a substrate surface of said base substrate by lamination, said group of group III nitride layers comprising
    a channel layer formed of a first group III nitride made of GaN, and
    a barrier layer formed of a second group III nitride having a composition of $In_{x2}Al_{y2}N$ (x2+y2=1, x2>0, y2>0),
    wherein said second group III nitride is a short-range-ordered mixed crystal having a short-range order parameter α satisfying a range where 0.4<α<1.

2. The epitaxial substrate for semiconductor device according to claim 1, wherein a bandgap of said second group III nitride is larger than a bandgap of said first group III nitride.

3. The epitaxial substrate for semiconductor device according to claim 1, wherein said second group III nitride is $In_{x2}Al_{y2}N$ (x2+y2=1, 0.14<x2<0.22).

4. The epitaxial substrate for semiconductor device according to claim 1, further comprising:
    a spacer layer formed of a third group III nitride having a composition of $In_{x3}Al_{y3}Ga_{z3}N$ (x3+y3+z3=1) and having a bandgap larger than that of said second group III nitride, said spacer layer containing at least Al and being formed between said channel layer and said barrier layer.

5. The epitaxial substrate for semiconductor device according to claim 4, wherein said third group III nitride is AlN.

6. A schottky junction structure of semiconductor device, comprising:
    an epitaxial substrate comprising
        a base substrate,
        a buffer layer made of AlN, and
        a group of group III nitride layers obtained by forming a (0001) crystal plane of each of said group III nitride layers so as to be approximately parallel to a substrate surface of said base substrate by lamination, the group of group III nitride layers comprising
            a channel layer formed of a first group III nitride made of GaN, and
            a barrier layer formed of a second group III nitride having a composition of $In_{x2}Al_{y2}N$ (x2+y2=1, x2>0, y2>0), wherein said second group III nitride is a short-range-ordered mixed crystal having a short-range order parameter α satisfying a range where 0.4<α<1; and
    a metal electrode formed on said barrier layer of said epitaxial substrate.

7. A method of suppressing leakage current of schottky junction between a group III nitride layer and a metal electrode of a semiconductor device, the method comprising the steps of:
    forming a buffer layer made of AlN on a base substrate;
    forming a channel layer made of GaN on said buffer layer;
    forming a group III nitride layer as a barrier layer on said channel layer, said group III nitride layer containing In and Al as group III elements and being formed as a short-range-ordered mixed crystal having a short-range order parameter α satisfying a range where 0.4<α<1; and
    forming a metal electrode on said group III nitride layer by schottky junction.

* * * * *